United States Patent
Xie

(10) Patent No.: US 11,616,107 B2
(45) Date of Patent: Mar. 28, 2023

(54) DISPLAY SUBSTRATE AND MANUFACTURING METHOD THEREOF, DISPLAY DEVICE

(71) Applicant: BOE TECHNOLOGY GROUP CO., LTD., Beijing (CN)

(72) Inventor: Dini Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 161 days.

(21) Appl. No.: 16/945,237

(22) Filed: Jul. 31, 2020

(65) Prior Publication Data
US 2021/0057492 A1    Feb. 25, 2021

(30) Foreign Application Priority Data
Aug. 22, 2019  (CN) .......................... 201910779225.4

(51) Int. Cl.
*H01L 27/32* (2006.01)
*H01L 51/56* (2006.01)
*H01L 51/52* (2006.01)

(52) U.S. Cl.
CPC ........ *H01L 27/326* (2013.01); *H01L 27/3246* (2013.01); *H01L 51/5237* (2013.01); *H01L 51/56* (2013.01); *H01L 2227/323* (2013.01)

(58) Field of Classification Search
CPC .......................... H01L 27/326; H01L 27/3225
See application file for complete search history.

(56) References Cited

U.S. PATENT DOCUMENTS

2017/0179092 A1    6/2017 Sasaki et al.
2020/0287162 A1*   9/2020 Chung ................ H01L 51/5253

FOREIGN PATENT DOCUMENTS

| CN | 108986678 A | 12/2018 |
| CN | 109616499 A | 4/2019 |
| CN | 109801903 A | 5/2019 |

OTHER PUBLICATIONS

First Office Action dated Apr. 22, 2021 for application No. CN 201910779225.4 with English translation attached.

* cited by examiner

*Primary Examiner* — Fernando L Toledo
*Assistant Examiner* — Valerie N Newton
(74) *Attorney, Agent, or Firm* — Nath, Goldberg & Meyer; Joshua B. Goldberg

(57) ABSTRACT

The present disclosure provides a display substrate and a manufacturing method thereof, and a display device. The display substrate includes a base substrate and a driving circuit layer located on the base substrate, each of the plurality of pixel units comprises a light emitting element, wherein a display surface of the display substrate comprises a central display region and a plurality of peripheral display regions located around the central display region, a light emitting element in the central display region is an organic light emitting diode, and a light emitting element in at least one of the plurality of peripheral display regions is a micro light emitting diode.

8 Claims, 6 Drawing Sheets

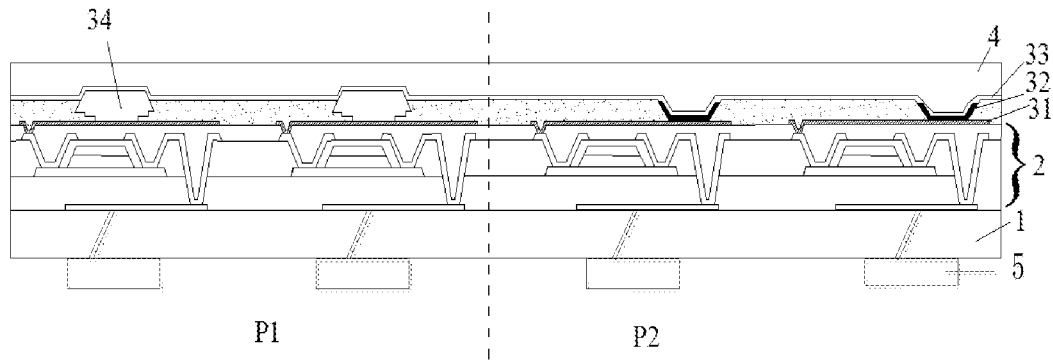

FIG. 2d

| forming a driving circuit layer on a base substrate and forming a plurality of first electrode on a surface of the driving circuit layer away from the base substrate | S11 |

↓

| transferring a mrico light emitting diode to each first electrode in at least one of peripheral display regions | S12 |

↓

| forming an organic light emitting diode on each first electrode in a central display region | S13 |

FIG. 3

DISPLAY SUBSTRATE AND MANUFACTURING METHOD THEREOF, DISPLAY DEVICE

CROSS-REFERENCE TO RELATED APPLICATION

The present application claims priority to Chinese Patent Application No. 201910779225.4, filed on Aug. 22, 2019, the content of which is incorporated herein by reference in the entirety.

TECHNICAL FIELD

The present disclosure relates to the field of display technology, more particularly, to a display substrate and a manufacturing method thereof, and a display device.

BACKGROUND

In an organic light emitting diode (OLED) display panel, since a light emitting material layer is more sensitive to water and oxygen, it is necessary to provide an encapsulation layer above a structure of an organic light emitting diode structure to cover the organic light emitting diode. As a result, a size of a bezel of the OLED display panel is relatively large, and it is difficult to achieve a narrow bezel design.

SUMMARY

In one aspect, the present disclosure provides a display substrate including: a base substrate and a plurality of pixel elements located on the base substrate, each of the plurality of pixel elements includes a light emitting element, where a display surface of the display substrate comprises a central display region and a plurality of peripheral display regions located around the central display region, a light emitting element in the central display region is an organic light emitting diode, and a light emitting element in at least one of the plurality of peripheral display regions is a micro light emitting diode.

According to an embodiment of the present disclosure, the light emitting element in each of the plurality of peripheral display regions is the micro light emitting diode.

According to an embodiment of the present disclosure, the micro light emitting diode is a vertical micro light emitting diode.

According to an embodiment of the present disclosure, an electrode of the micro light emitting diode away from the base substrate and an electrode of the organic light emitting diode away from the base substrate are electrically coupled with each other.

According to an embodiment of the present disclosure, the display substrate further includes a binding region located on a surface of the base substrate away from the light emitting element and electrically coupled with the light emitting element through a via hole in the base substrate.

In another aspect, the present disclosure provides a method of manufacturing the display substrate according to the first aspect of the present disclosure, including: forming a driving circuit layer on a base substrate and forming a plurality of first electrodes on a surface of the driving circuit layer away from the base substrate; transferring a micro light emitting diode to each of first electrodes in at least one of the peripheral display regions; and forming an organic light emitting diode on each of first electrodes in a central display region, where the driving circuit layer drives the micro light emitting diode and the organic light emitting diode to emit light through the first electrodes.

According to an embodiment of the present disclosure, the forming an organic light emitting diode on each of first electrode in the central display region includes: forming a pixel defining layer on the surface of the driving circuit layer away from the base substrate, where the pixel defining layer is formed to surround the micro light emitting diode and expose the first electrode of the organic light emitting diode close to the base substrate; forming an integrated light emitting material layer on a surface of the pixel defining layer away from the base substrate; and forming a common electrode layer on a surface of the light emitting material layer away from the base substrate, where the common electrode layer is formed to electrically couple second electrodes of the organic light emitting diode and the micro light emitting diode away from the base substrate.

According to an embodiment of the present disclosure, the method further includes forming a thin film encapsulation layer on a surface of the common electrode layer away from the base substrate, where the thin film encapsulation layer is formed to cover only the organic light emitting diode.

According to an embodiment of the present disclosure, the method further includes forming a binding layer on a surface of the base substrate away from the driving circuit layer, where the binding layer is formed to be electrically coupled with the driving circuit layer through a via hole in the base substrate.

According to an embodiment of the present disclosure, the micro light emitting diode is formed as a vertical micro light emitting diode.

According to an embodiment of the present disclosure, the forming an organic light emitting diode on each of first electrode in the central display region includes: forming a pixel defining layer on a surface of the driving circuit layer away from the base substrate, where the pixel defining layer is formed to expose the first electrodes; forming a plurality of light emitting material layers independent of each other on a surface of the pixel defining layer away from the base substrate; and forming a common electrode layer on surfaces of the plurality of light emitting material layers away from the base substrate, wherein the common electrode layer is formed to electrically couple second electrodes of the organic light emitting diode and the micro light emitting diode away from the base substrate.

According to an embodiment of the present disclosure, the method further includes forming a thin film encapsulation layer on a surface of the common electrode layer away from the base substrate, wherein the thin film encapsulation layer is formed to cover the micro light emitting diode and the organic light emitting diode.

According to an embodiment of the present disclosure, the method further includes forming a binding layer on a surface of the base substrate away from the driving circuit layer, where the binding layer is formed to be electrically coupled with the driving circuit layer through a via hole in the base substrate.

According to an embodiment of the present disclosure, the micro light emitting diode is formed as a vertical micro light emitting diode.

In another aspect, the present disclosure also provides a display device including the display substrate described herein or manufactured according to the method described herein.

BRIEF DESCRIPTION OF THE FIGURES

FIGS. 2a to 2d are schematic diagrams showing structures of a display substrate in different manufacturing stages according to another embodiment of the present disclosure;

FIG. 3 is a flowchart of a method of manufacturing a display substrate according to an embodiment of the present disclosure;

DETAILED DESCRIPTION

Figure 1A:
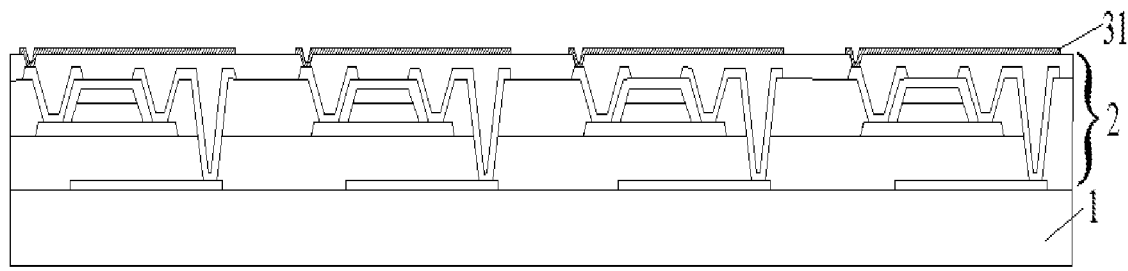
FIGS. 1a to 1f are schematic diagrams showing structures of a display substrate in different manufacturing stages according to an embodiment of the present disclosure.

To make those skilled in the art better understand the technical solutions of the present disclosure, the present disclosure will be further described in detail below in conjunction with the accompanying drawings and embodiments. It should be noted that the following description of some embodiments has been presented for purposes of illustration and description, and it is not intended to be exhaustive or to limit the present disclosure to the precise forms disclosed, and the repeated description is omitted in order to avoid redundancy.

In order to keep the following description of the embodiments of the present disclosure clear and concise, detailed description of known functions and components may be omitted. When any component of an embodiment of the present disclosure appears in more than one drawings, the component is denoted by a same reference numeral in each drawing.

The present disclosure provides a display substrate and a manufacturing method thereof, and a display device that substantially obviate one or more of problems due to limitations and disadvantages of the related art. In the present disclosure, by disposing one or more micro light emitting diodes in a peripheral display region of the display substrate, on one hand, the bezel of the peripheral display region of the display substrate is narrowed and a production efficiency and yield of the products are improved; on the other hand, when a plurality of display substrates are spliced into a larger-sized display panel, a display resolution of the display panel can be improved.

In one aspect, the present disclosure provides a display substrate. In some implementations, the display substrate may include a base substrate and a plurality of pixel units located on the base substrate, each of the plurality of pixel units includes a light emitting element, where a display surface of the display substrate comprises a central display region and a plurality of peripheral display regions located around the central display region, the light emitting elements in the central display region are organic light emitting diodes, and the light emitting elements in at least one of the plurality of peripheral display regions are micro light emitting diodes.

Figure 1B:
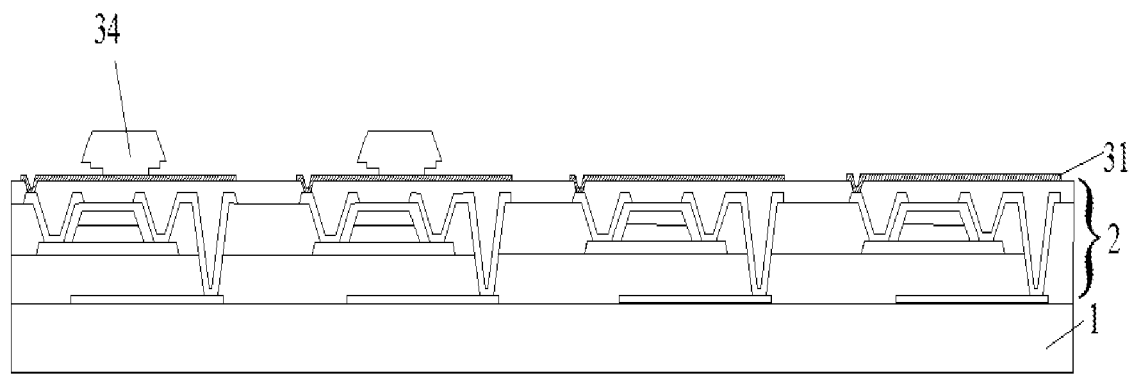
Figure 1C:
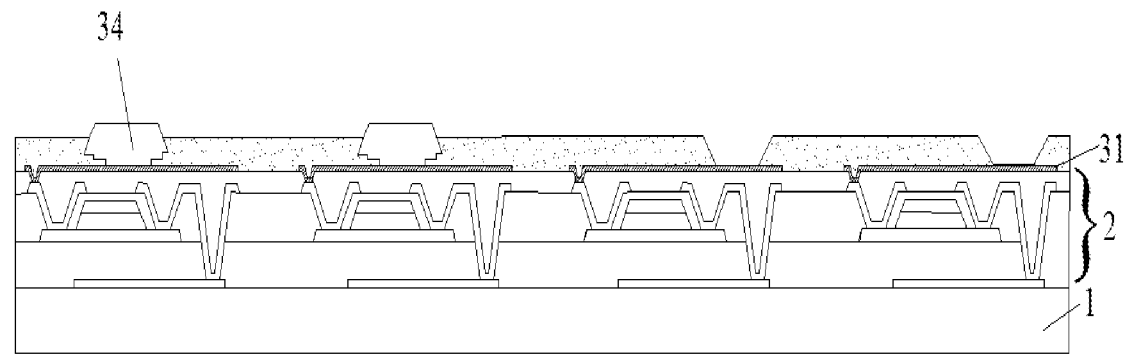
Figure 1D:
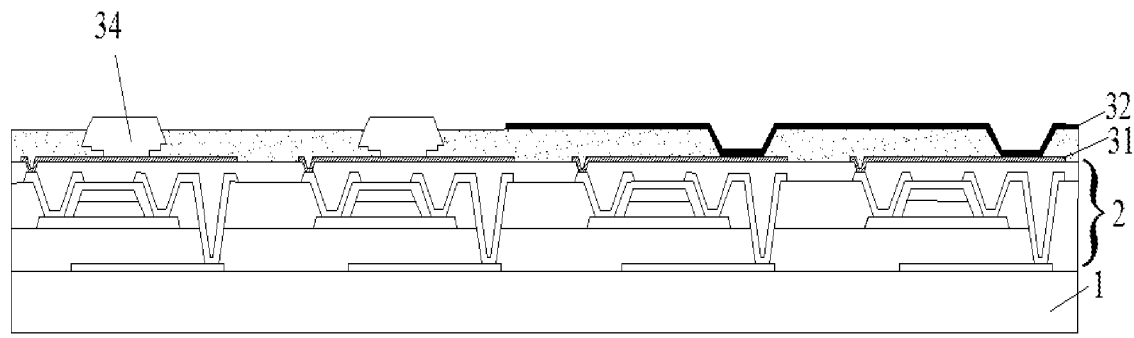
Figure 1E:
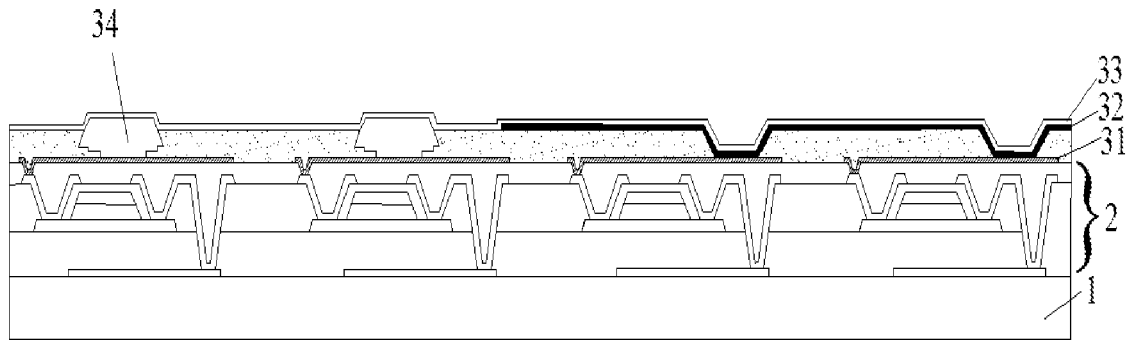
Figure 1F:
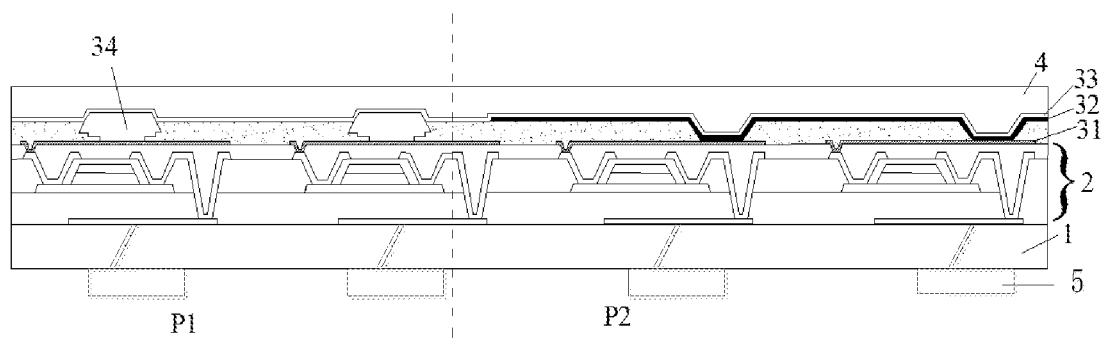

FIG. 1f is a schematic diagram showing a structure of a display substrate according to an embodiment of the present disclosure, and FIG. 2d is a schematic diagram showing a structure of a display substrate according to another embodiment of the present disclosure. Referring to FIGS. 1f and 2d, in some implementations, the display substrate may include a base substrate 1 and a plurality of light emitting elements disposed on the base substrate 1, where each light emitting element may participate in the formation of a pixel unit (for black and white display substrate/panel) or a sub-pixel unit (for color display substrate/panel).

In some implementations, the display substrate may have a display surface and multiple side surfaces coupled with the display surface. For example, taking a current view of FIG. 1f as an example, for a top-emission display substrate, an upper surface of the display substrate is a light emitting surface, and a left surface of the display substrate is a side surface (for example, a first side surface).

In some implementations, the display substrate may be divided into a central display region P2 and a plurality of peripheral display regions P1 around the central display region P2, the peripheral display regions P1 are in one-to-one correspondence with the side surfaces, that is, each peripheral display region P1 is connected to a corresponding side surface. In some implementations, the light emitting surface of the display substrate may have a rectangular shape, but the present disclosure is not limited thereto. In a case where the light emitting surface has a rectangular shape, the display substrate has four side surfaces, and the side surfaces are in one-to-one correspondence with the peripheral display regions P1. FIG. 1f shows one peripheral display region P1.

In some implementations, the light emitting element in the central display region P2 may be organic light emitting diodes, and the light emitting elements in at least one of the peripheral display regions P1 may be micro light emitting diodes 34. In some implementations, the light emitting elements in the central display region P2 may be the organic light emitting diodes, and the light emitting elements in all of the peripheral display regions P1 are the micro light emitting diodes 34.

A manufacturing cost of the organic light emitting diode is lower than that of the micro light emitting diode 34, and a transfer rate of the micro light emitting diodes 34 is lower than that of the organic light emitting diodes. Therefore, the light emitting diodes in the central display region P2 preferably adopt the organic light emitting diodes. It should be noted that in the embodiment shown in FIG. 1f, light emitting material layers 32 of all organic light emitting diodes are connected as a whole; and in the embodiment shown in FIG. 2d, the light emitting material layers 32 of the organic light emitting diodes are separated from each other. The light emitting material layer 32 may be, for example, an organic composite light emitting layer, and may also include other layer structures such as an electron transport layer and a hole transport layer, and these layer structures can be configured according to the related art and will not be repeated here in detail.

The micro light emitting diode 34 (also called as Micro-LED (Micro Lighting Emitting Diode) or Mini-LED (Mini Lighting Emitting Diode)) has an advantage of not being required to encapsulated by a thin film encapsulation layer 4. Therefore, by disposing the micro light emitting diodes 34 in the peripheral display region P1, a distance between the outermost micro light emitting diode 34 and a boundary of the display substrate at this side is smaller, and thus it is capable of narrowing the bezel at the side where the peripheral display region P1 is located. Therefore, a problem that the bezel of the OLED display panel is difficult to be narrowed is solved. In addition, due to a limitation on the technology of transferring the micro light emitting diodes, by means of disposing OLEDs in the central display region, the production efficiency and yield of the products can also be improved. In addition, when the plurality of display substrates are spliced into a larger-sized display panel, the display resolution of the display panel can be improved.

As described above, in some implementations, the light emitting elements in each of the peripheral display regions P1 may be the micro light emitting diodes 34. That is, the micro light emitting diodes 34 surround the organic light emitting diodes, so that the bezels at the side surfaces of the display substrate can be narrowed.

In some implementations, each of the micro light emitting diodes 34 may be a vertical micro light emitting diode. Generally, a driving circuit layer 2 is provided on the base substrate 1, and the driving circuit layer 2 is coupled to the electrodes 31 to provide driving signals for the micro light emitting diodes 34 and the organic light emitting diodes. The driving circuit layer 2 may be provided with, for example, driving transistors, gate lines, data lines, which can be configured according to the related art and will not be described in detail here. Since only one electrode 31 needs to be provided on the driving circuit layer 2 for one vertical micro light emitting diode, the vertical micro light emitting diode occupies a relative small area. It should be noted that the present disclosure is not limited thereto, and each of the micro light emitting diodes 34 may also be a horizontal micro light emitting diode. However, the horizontal micro light emitting diode occupies a relative large area, and two electrodes need to be provided on the driving circuit layer 2 for one horizontal micro light emitting diode, thus the structure of the driving circuit layer 2 will be more complicated.

In some implementations, in the embodiments shown in FIGS. 1f and 2d, electrodes of the micro light emitting diodes 34 away from the base substrate 1 and electrodes of the organic light emitting diodes away from the base substrate 1 may be electrically coupled to each other. For example, all the micro light emitting diodes 34 and the organic light emitting diodes may share a cathode.

In some implementations, the display substrate further includes a binding region 5 located on a surface of the base substrate 1 away from the light emitting elements of the display substrate, that is, the binding region 5 and the light emitting elements are located on different sides of the base substrate 1. The binding region 5 may be provided with devices such as a driving chip, a flexible circuit board, etc., which are electrically coupled to the electrodes in the driving circuit layer 2 through via holes in the base substrate 1. By means of thus connection method, the bezels of the display substrate can be narrowed more easily.

In another aspect, the present disclosure also provides a method of manufacturing a display substrate. In some implementations, the method may include: forming a driving circuit layer on a surface of a base substrate and forming a plurality of first electrodes on a surface of the driving circuit layer away from the base substrate; transferring micro light emitting diodes to the first electrodes in at least one peripheral display region respectively; and forming organic light emitting diodes on the first electrodes in a central display region, where the driving circuit layer drives the micro light emitting diodes and the organic light emitting diodes to emit light through the first electrodes.

FIG. 3 is a flowchart of a method of manufacturing a display substrate according to an embodiment of the present disclosure. Referring to FIG. 3, the method includes steps S11 to S13.

In step S11, a driving circuit layer 2 is formed on a base substrate 1 and a plurality of first electrodes 31 are formed on a surface of the driving circuit layer 2 away from the base substrate 1.

In step S12, micro light emitting diodes 34 are transferred to the first electrode 31 in at least one of peripheral display regions P1 respectively. That is, the first electrodes 31 serve as electrodes of the micro light emitting diodes 34 or are electrically coupled to the electrodes of the micro light emitting diodes 34.

In step S13, organic light emitting diodes are formed on the first electrode 31 in the central display region P2 respectively, where the driving circuit layer 2 drives the micro light emitting diodes 34 and the organic light emitting diodes to emit light through the first electrodes 31.

As mentioned above, since the micro-light emitting diodes 34 have the advantage of not requiring to be encapsulated by a thin-film encapsulation layer 4, the distance between the outermost micro-light emitting diode 34 and the boundary of the display substrate at this side is relative small, and thus it is capable of narrowing the bezel at the side where the peripheral display region P1 is located.

Figure 4:
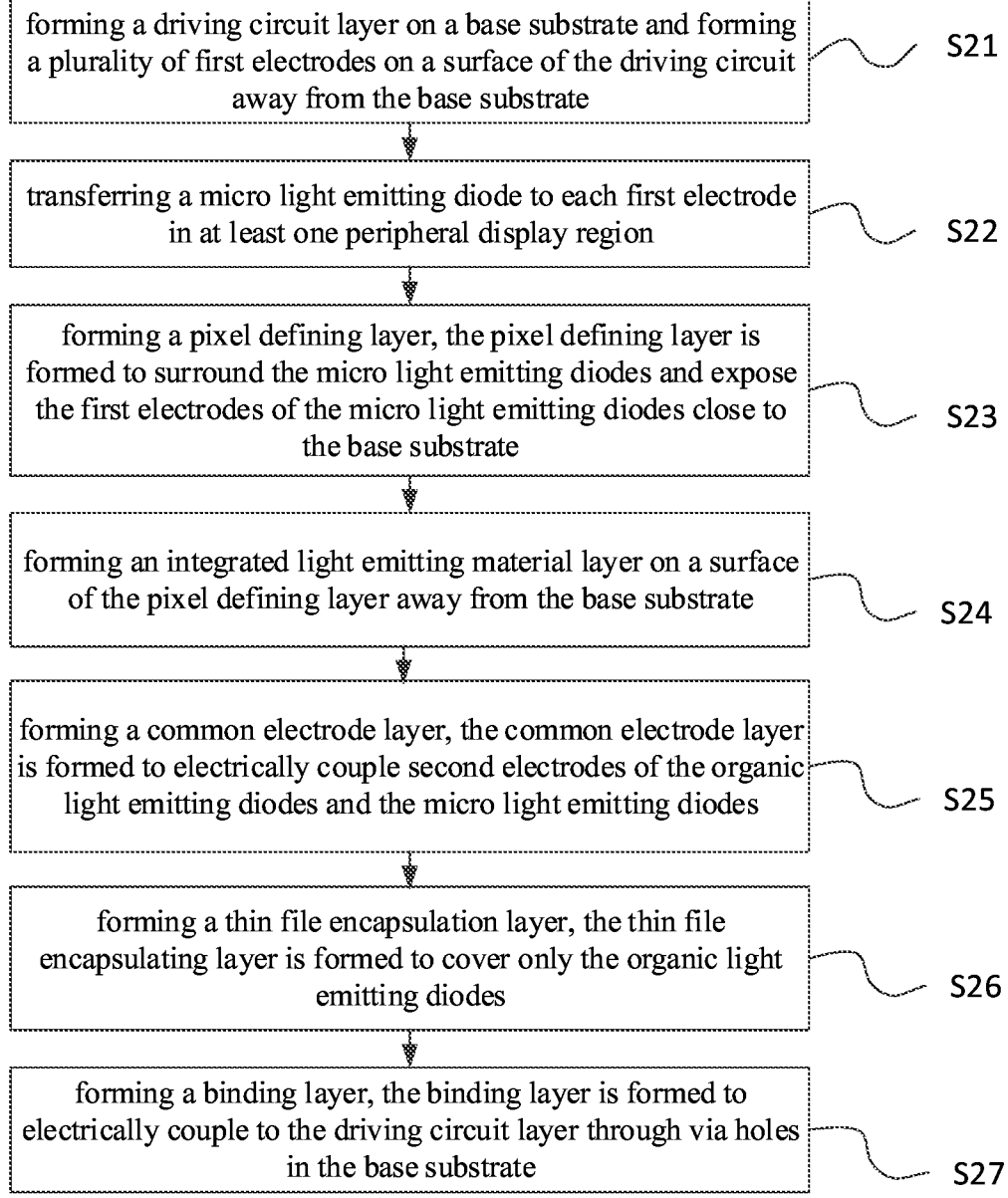
FIG. 4 is a flowchart of a method of manufacturing a display substrate according to an embodiment of the present disclosure.

FIG. 4 is a flowchart of a method of manufacturing a display substrate according to an embodiment of the present disclosure. Referring to FIG. 4 in combination with FIGS. 1a to 1f, in some implementations, the method includes steps S21 to S27.

In step S21, as shown in FIG. 1a, a base substrate 1 is provided, and a driving circuit layer 2 is formed on a surface of the base substrate 1, where the driving circuit layer 2 can be formed by a process such as a printing process, and a plurality of first electrodes 31 are formed on a surface of the driving circuit layer 2 away from the base substrate 1.

In step S22, as shown in FIG. 1b, the micro light emitting diodes 34 are transferred to the first electrodes 31 in at least one of the peripheral display regions P1, respectively, by a transfer process. In this embodiment, the micro light emitting diodes 34 are shown as the vertical micro light emitting diodes, and two transferred micro light emitting diodes are shown in FIG. 1b, but the present disclosure is not limited thereto. For example, the micro light emitting diode 34 may be a horizontal type micro light emitting diode, and a plurality of micro light emitting diodes may be transferred. In some implementations, the transferred micro light emitting diodes 34 are also called as LED lamps.

In step S23, as shown in FIG. 1c, a pixel defining layer is formed on the surface of the driving circuit layer 2 away from the base substrate 1. The pixel defining layer is formed to surround the micro light emitting diodes 34 and expose the first electrodes 31 that are used as electrodes of the micro light emitting diodes 34 close to the base substrate 1. It should be noted that, it should be ensured that the transferred micro light emitting diodes 34 will not be affected by a coating process/printing process of the pixel defining layer. For example, a temperature of the post-baking process when the pixel defining layer is formed should be controlled so as not to damage the transferred micro light emitting diodes 34.

In step S24, as shown in FIG. 1d, an integrated light emitting material layer 32 is formed on a surface of the pixel defining layer away from the base substrate 1 by a process such as a printing process. For example, for a part of the light emitting material layer 32 for the organic light emitting diode, it may be formed into a WOLED structure.

In step S25, as shown in FIG. 1e, a common electrode layer 33 for electrically coupling second electrodes of the organic light emitting diode and the micro light emitting diodes 34 away from the base substrate 1 is formed on surfaces of the micro light emitting diodes 34 and the light emitting material layers 32 away from the base substrate 1. In other words, the common electrode layer 33 may be used as a common electrode of the micro light emitting diodes 34 and the organic light emitting diodes.

In step S26, as shown in FIG. 1f, a thin film encapsulation layer 4 is formed on a surface of the common electrode layer 33 away from the base substrate 1. The thin film encapsulation layer 4 may be formed to cover the micro light emitting diodes 34 and the organic light emitting diodes, at this time, a part of the film encapsulation layer 4 covering the micro light-emitting diode 34 is thinner than the other part of the film encapsulation layer 4 covering the organic light emitting diode. Due to the micro light emitting diodes 34, at the boundary position where the micro light emitting diodes 34 are provided, an orthographic projection of the thin film encapsulation layer 4 on the base substrate 1 does not have to cover an orthographic projection of the micro light emitting diode 34 on the base substrate 1, that is, the bezels of the display substrate do not need to leave a large margin. In some implementations, the film encapsulation layer 4 may be formed to cover only the organic light emitting diodes, but does not cover the micro light emitting diodes 34. In some implementations, the film encapsulation layer 4 may be formed to cover the micro light emitting diodes 34 and the organic light emitting diodes, but it only covers the light emitting surface of the micro light emitting diodes 34, and does not cover side surfaces of the micro light emitting diodes 34.

In step S27, as shown in FIG. 1f, a binding region 5 may be formed on a surface of the base substrate 1 away from the driving circuit layer 2, that is, the binding region 5 and the driving circuit layer 2 are formed on different surfaces of the base substrate 1. The binding region 5 is electrically coupled to the driving circuit layer 2 through via holes in the base substrate 1. In some implementations, the binding region 5 may be provided with devices such as a driving chip, a flexible circuit board and the like. In this case, electrodes of the devices such as the driving chip, the flexible circuit board and the like are electrically coupled to the driving circuit layer 2 through the via holes in the base substrate 1. By means of thus connection method, the bezels of the display substrate can be narrowed more easily.

As mentioned above, since the micro light emitting diodes 34 have the advantage of not requiring to be encapsulated by a thin-film encapsulation layer 4, the distance between the outermost micro-light emitting diodes 34 and the boundary of the display substrate at this side is relative small, and thus it is capable of narrowing the bezel at a side where the peripheral display region P1 is located.

Figure 5:
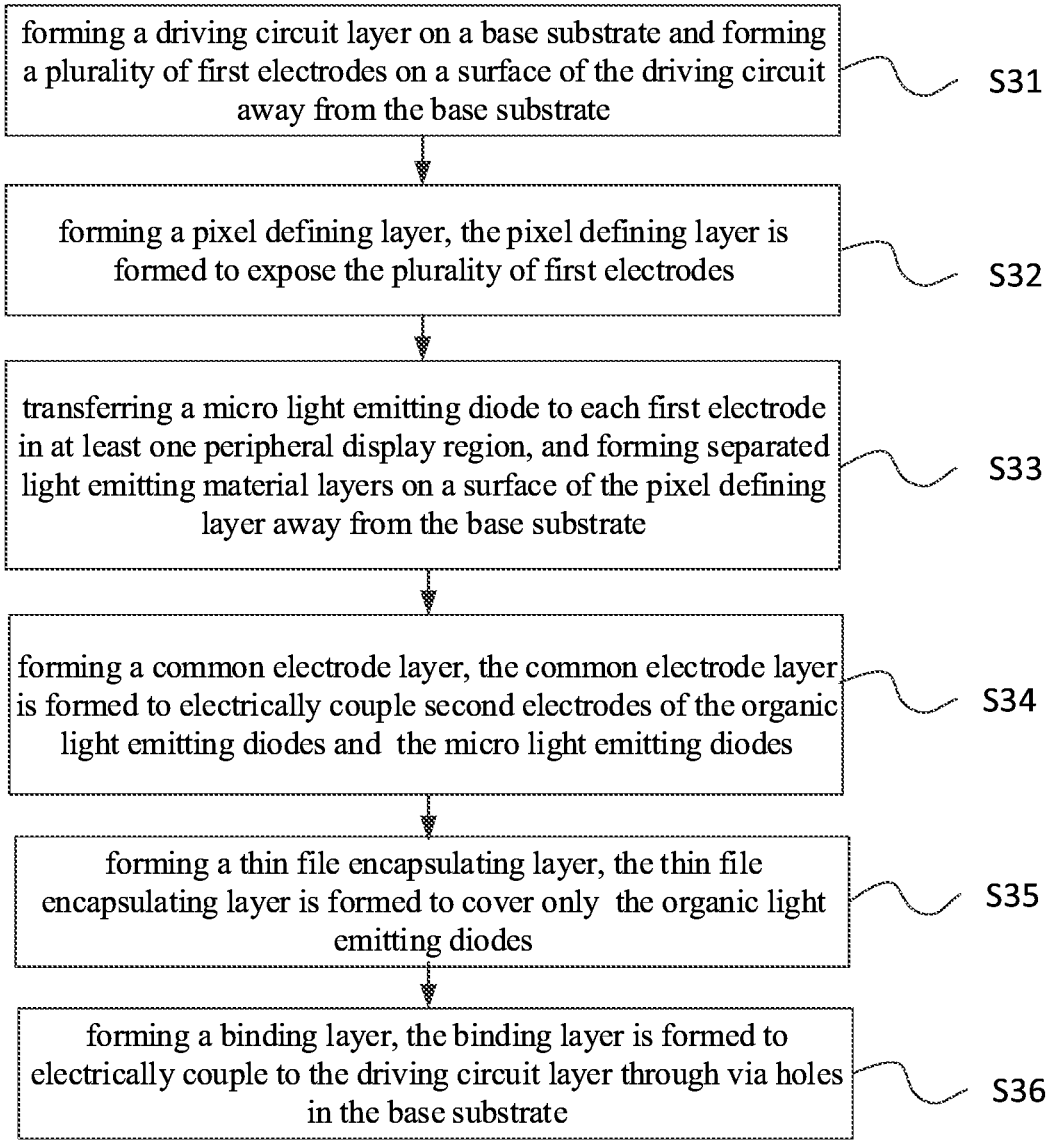
FIG. 5 is a flowchart of a method of manufacturing a display substrate according to an embodiment of the present disclosure.

FIG. 5 is a flowchart of a method of manufacturing a display substrate according to an embodiment of the present disclosure. Referring to FIG. 5 in combination with FIGS. 2a to 2d, in some implementations, the method includes steps S31 to S36. In order to make the description to be more brief, the description of the same steps as FIG. 4 may not be repeated here.

Figure 2A:
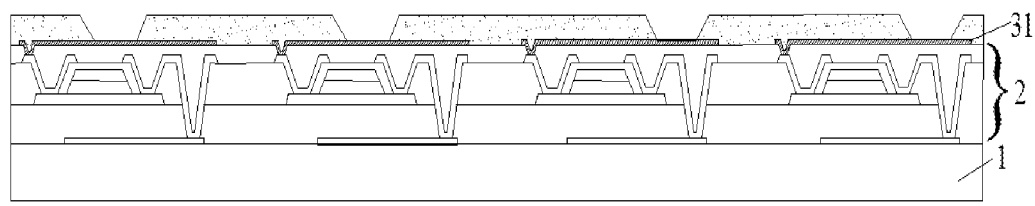

In some implementations, as shown in FIG. 2a, the micro light emitting diodes 34 may be transferred after the pixel defining layer is formed on the surface of the driving circuit layer 2 away from the base substrate 1. In this way, the influence of the formation process of the pixel defining layer on the micro light emitting diodes 34 can be effectively avoided. It should be noted that a patterning process can be used to ensure that a size of the via hole formed in the pixel defining layer exactly matches a size of the LED lamp, that is, the micro light emitting diode 34.

Figure 2B:
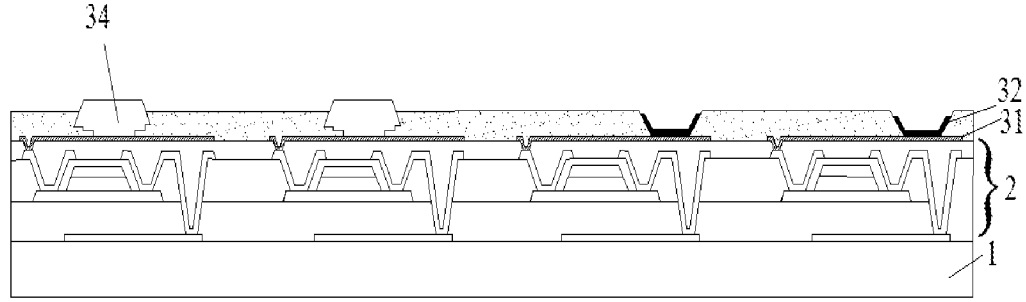

In step S33, as shown in FIG. 2b, first, the micro light emitting diodes 34 are transferred to the first electrodes 31 in at least one of the peripheral display regions P1 through a transfer process, and then, a plurality of light emitting material layers 32 independent of each other are formed on surfaces of the first electrodes 31 in the central display region P2 away from the base substrate 1. That is, the light emitting material layers 32 of the respective organic light emitting diodes are separated from each other.

Figure 2C:
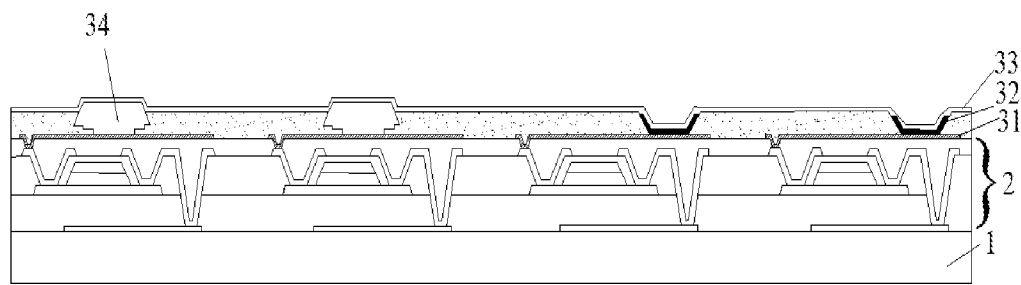

In step S34, as shown in FIG. 2c, a common electrode layer 33 for electrically coupling second electrodes of the organic light emitting diode and the micro light emitting diodes 34 away from the base substrate 1 together is formed on surfaces of the organic light emitting diodes and the light emitting material layers 32 away from the base substrate 1.

It should be noted that, in the embodiments shown in FIGS. 4 and 5, the micro light emitting diodes 34 are transferred first, and then the light emitting material layer 32 is formed. This is because the light emitting material layer 32 has extremely high requirements on the environmental and is extremely sensitive to water and oxygen. If the light emitting material layer 32 is formed first and then the micro light emitting diode 34 is transferred, this has extremely high requirements on the process environment.

As mentioned above, since the micro light emitting diodes 34 have the advantage of not requiring to be encapsulated by a thin-film encapsulation layer 4, the distance between the outermost micro-light emitting diodes 34 and the boundary of the display substrate at this side is relative small, and thus it is capable of narrowing the bezel at the side where the peripheral display region P1 is located.

In another aspect, the present disclosure provides a display device including the display substrate described herein or manufactured by the method described herein. In some implementations, the display device includes a display panel. In some implementations, the display panel includes a display substrate described herein or manufactured by the method described herein, and an opposite substrate. Appropriate display devices include, but are not limited to, any products or components with display function, such as OLED display panels, mobile phones, tablet computers, televisions, displays, notebook computers, digital photo frames, navigators, etc.

It is to be understood that the above description is only for the purpose of illustrating the principles of the present disclosure, but the disclosure is not limited thereto. Various modifications and improvements can be made by those skilled in the art without departing from the spirit and scope of the disclosure, and such modifications and improvements are also considered to be within the scope of the disclosure.

What is claimed is:

1. A display substrate, comprising:
a base substrate; and
a plurality of pixel units located on the base substrate, each of the plurality of pixel units comprises a light emitting element,
wherein a display surface of the display substrate comprises a central display region and a plurality of peripheral display regions located around the central display region, a light emitting element in the central display region is an organic light emitting diode, and a light emitting element in at least one of the plurality of peripheral display regions is a micro light emitting diode, the light emitting element in each of the plurality of peripheral display regions is a vertical micro light emitting diode; an electrode of the vertical micro light emitting diode away from the base substrate and an electrode of the organic light emitting diode away from the base substrate are electrically coupled with each other; and wherein the display substrate further comprises a binding region located on a surface of the base substrate away from the light emitting element and electrically coupled with the light emitting element through a via hole in the base substrate.

2. A display device, comprising the display substrate of claim 1.

3. A method of manufacturing the display substrate of claim 1, comprising:

forming a driving circuit layer on a base substrate and forming a plurality of first electrodes on a surface of the driving circuit layer away from the base substrate;

transferring a micro light emitting diode to each of first electrodes in at least one of peripheral display regions; and forming an organic light emitting diode on each of first electrode in a central display region, wherein the driving circuit layer drives the micro light emitting diode and the organic light emitting diode to emit light through the first electrodes, wherein the forming an organic light emitting diode on each of first electrodes in the central display region comprises: forming a pixel defining layer on the surface of the driving circuit layer away from the base substrate, wherein the pixel defining layer is formed to surround the micro light emitting diode and expose the first electrode of the organic light emitting diode close to the base substrate; forming an integrated light emitting material layer on a surface of the pixel defining layer away from the base substrate; and forming a common electrode layer on a surface of the light emitting material layer away from the base substrate, wherein the common electrode layer is formed to electrically couple second electrodes of the organic light emitting diode and the micro light emitting diode away from the base substrate; and wherein the method further comprises:

forming a thin film encapsulation layer on a surface of the common electrode layer away from the base substrate, wherein the thin film encapsulation layer is formed to cover only the organic light emitting diode; and forming a binding layer on a surface of the base substrate away from the driving circuit layer, wherein the binding layer is formed to be electrically coupled with the driving circuit layer through a via hole in the base substrate.

4. The method of claim 3, wherein the micro light emitting diode is formed as a vertical micro light emitting diode.

5. The method of claim 3, wherein the forming an organic light emitting diode on each of first electrodes in the central display region comprises:

forming a pixel defining layer on a surface of the driving circuit layer away from the base substrate, wherein the pixel defining layer is formed to expose the first electrodes;

forming a plurality of light emitting material layers independent of each other on a surface of the pixel defining layer away from the base substrate; and forming a common electrode layer on surfaces of the plurality of light emitting material layers away from the base substrate, wherein the common electrode layer is formed to electrically couple second electrodes of the organic light emitting diode and the micro light emitting diode away from the base substrate.

6. The method of claim 5, further comprising:

forming a thin film encapsulation layer on a surface of the common electrode layer away from the base substrate, wherein the thin film encapsulation layer is formed to cover the micro light emitting diode and the organic light emitting diode.

7. The method of claim 6, further comprising:

forming a binding layer on a surface of the base substrate away from the driving circuit layer, wherein the binding layer is formed to be electrically coupled with the driving circuit layer through a via hole in the base substrate.

8. The method of claim 7, wherein the micro light emitting diode is formed as a vertical micro light emitting diode.

* * * * *